(12) United States Patent
Pal et al.

(10) Patent No.: US 8,278,165 B2
(45) Date of Patent: Oct. 2, 2012

(54) METHODS FOR PROTECTING FILM LAYERS WHILE REMOVING HARDMASKS DURING FABRICATION OF SEMICONDUCTOR DEVICES

(75) Inventors: Rohit Pal, Fishkill, NY (US); Janice Monzet, Wappingers Falls, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 331 days.

(21) Appl. No.: 12/577,628

(22) Filed: Oct. 12, 2009

(65) Prior Publication Data

US 2011/0086495 A1    Apr. 14, 2011

(51) Int. Cl.
*H01L 21/8238* (2006.01)

(52) U.S. Cl. ........ 438/199; 438/216; 438/492; 438/738; 438/770; 257/E21.09; 257/E21.234; 257/E21.271; 257/E21.285; 257/E21.639

(58) Field of Classification Search ........... 438/199, 438/216, 492, 738, 770; 257/E21.09, E21.234, 257/E21.271, E21.285, E21.639
See application file for complete search history.

(56) References Cited

U.S. PATENT DOCUMENTS

| 8,017,469 | B2 * | 9/2011 | Luo et al. | 438/216 |
| 2006/0228851 | A1 * | 10/2006 | Sadaka et al. | 438/199 |

* cited by examiner

*Primary Examiner* — Mary Wilczewski
*Assistant Examiner* — Toniae Thomas
(74) *Attorney, Agent, or Firm* — Ingrassia Fisher & Lorenz, P.C.

(57) ABSTRACT

Methods for fabricating semiconductor devices are provided. The methods include providing a semiconductor substrate having pFET and nFET regions, each having active areas and shallow trench isolation. A hardmask layer is formed overlying the semiconductor substrate. A photoresist layer is provided over the hardmask layer. The phoresist layer is patterned. An exposed portion of the hardmask layer is removed from one of the pFET region and nFET region with the patterned photoresist acting as an etch mask to define a masked region and an unmasked region. An epitaxial silicon layer is formed on the active area in the unmasked region. A protective oxide layer is formed overlying the epitaxial silicon layer. The hardmask layer is removed from the masked region with the protective oxide layer protecting the epitaxial silicon layer during such removal step. The protective oxide layer is removed from the epitaxial silicon layer.

19 Claims, 2 Drawing Sheets

METHODS FOR PROTECTING FILM LAYERS WHILE REMOVING HARDMASKS DURING FABRICATION OF SEMICONDUCTOR DEVICES

FIELD OF THE INVENTION

The present invention generally relates to methods for fabricating semiconductor devices, and more particularly relates to methods for protecting film layers while removing hardmasks during fabrication of semiconductor devices.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the semiconductor substrate through which a current can flow. A gate insulator is disposed between the gate electrode and the semiconductor substrate to electrically isolate the gate electrode from the semiconductor substrate. A control voltage applied to the gate electrode controls the flow of current through a channel in the semiconductor substrate underlying the gate electrode between the source and drain regions. P-channel MOS transistors are formed in "pFET regions" of the semiconductor substrate and N-channel MOS transistors are formed in "nFET regions", each of the pFET region and nFET region having an active area. The term "active area" is intended to mean part of a transistor structure through which the current is designed to flow. The semiconductor substrate may comprise shallow trench isolation (STI) regions used to electrically isolate regions of the semiconductor substrate. The trenches of the shallow trench isolation (STI) regions are filled with a deposited insulator, typically silicon dioxide.

There is a continuing trend to incorporate more and more circuitry on a single IC chip. To incorporate the increasing amount of circuitry, the size of each individual device in the circuit and the size and spacing between device elements (the feature size) must decrease. To achieve scaling of semiconductor devices, a variety of unconventional, sensitive, and/or "exotic" materials are being used. For example, high dielectric constant materials, also referred to as "high-k dielectrics", such as hafnium dioxide ($HfO_2$), hafnium silicon oxynitride (HfSiON), or zirconium dioxide ($ZrO_2$) are considered for the 45 nm node technology and beyond to allow scaling of gate insulators. To prevent Fermi-level pinning, metal gates (MG) with the proper work function are used as gate electrodes on the high-K gate dielectrics, which along with the gate insulator, form gate stacks.

During fabrication of a semiconductor device, prior to gate stack formation, a silicon epitaxy may be performed on the active area of the semiconductor substrate to form an epitaxial silicon layer thereon to improve the performance of the transistors to be built, particularly high-K metal gate transistors. Such epitaxial silicon layers typically comprise a semiconductor material selected from the group consisting of silicon, silicon germanium (SiGe) and silicon carbon (SiC), or a combination thereof. Such semiconductor material is sensitive to liquid etchants such as hot phosphoric acid used to remove silicon nitride hardmasks (hereinafter "nitride hardmask") that may be used as etch masks or selective deposition or growth masks. Removal of nitride hardmasks can damage such sensitive epitaxial silicon layers. Removal of nitride hardmasks can also damage other types of sensitive materials used in film layers.

A conventional nitride hardmask integration for patterning a SiGe epitaxial silicon layer on a pFET active area is illustrated in FIGS. 1-6. After definition of pFET and nFET active areas 16 and 18 and shallow isolation trenches 20 in a semiconductor substrate 10 as shown in FIG. 1, a nitride hardmask 22 is then deposited overlying a top surface of the semiconductor substrate 10 (FIG. 2). There may be a sacrificial oxide layer (not shown) underlying the nitride hardmask. Next, a layer of photoresist 24 is provided over the nitride hardmask and patterned as shown in FIG. 3. Next, a dry etch step is undertaken, removing the exposed portion of the nitride hardmask from the pFET region 12, with the patterned photoresist acting as an etch mask (FIG. 4), leaving the nitride hardmask portion overlying the nFET region 14. Subsequently, the photoresist is removed and oxide residues removed by wet etching using sulphuric peroxide and hydrofluoric acid (HF) (not shown). A SiGe epitaxial silicon layer 26 is then grown on the pFET active area 16 (FIG. 5). The nitride hardmask is then etched from the nFET region 14 using wet etch chemistries, such as hot phosphoric acid (FIG. 6). It is during this wet etch that the exposed epitaxial silicon layer (in this case, SiGe) will get damaged.

Typical wet etch chemistries which remove the nitride hardmask from the surface of the semiconductor substrate will also remove some of the SiGe epitaxial silicon layer, resulting in a degradation of the surface of the semiconductor substrate and a potential problem with undercutting of the SiGe epitaxial silicon layer. Exemplary SiGe loss 27 during the nitride hardmask etch is shown in FIG. 6. For example, the hot phosphoric acid used to remove the nitride hardmask from the nFET region can cause etching or pitting of the exposed SiGe epitaxial silicon layer on the pFET active area. A SiC epitaxial silicon layer is similarly susceptible to damage from hot phosphoric acid. For critical semiconductor materials such as SiGe and SiC, such damage is unacceptable. This resulting damage can degrade performance or even render a semiconductor device unusable.

In an effort to avoid such damage, a silicon oxide hardmask (hereinafter "oxide hardmask") (not shown) rather than a nitride hardmask has been used. The oxide hardmask is typically grown on the pFET and nFET active areas of the semiconductor substrate. However, removal of the oxide hardmask itself may be problematic. The oxide hardmask is typically stripped with hydrofluoric acid (HF) which causes significant and unacceptable STI loss which can also degrade performance and render the semiconductor device unusable. The extent of STI loss with use of an oxide hardmask is typically about 15 nm for nFET active areas and 30 nm for pFET active areas.

Accordingly, it is desirable to provide methods for protecting exposed film layers including epitaxial silicon layers against damage while removing hardmasks using wet etch chemistries that would otherwise damage the film layer and cause significant STI loss. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for fabricating a semiconductor device. In accordance with one exemplary embodiment, a method for fabricating the semiconductor device comprises providing a semiconductor substrate having pFET and nFET regions, each having active areas and shallow trench isolation. A hardmask layer is formed overlying the semiconductor substrate. A photoresist layer is provided over the hardmask layer. The phoresist layer is patterned. An exposed portion of the hardmask layer is removed from one of the pFET region and nFET region with the patterned photoresist acting as an etch mask to define a masked region and an unmasked region. An epitaxial silicon layer is formed on the active area in the unmasked region. A protective oxide layer is formed overlying the epitaxial silicon layer. The hardmask layer is removed from the masked region with the protective oxide layer protecting the epitaxial silicon layer during such removal step. The protective oxide layer is removed from the epitaxial silicon layer.

A method is provided for protecting an epitaxial silicon layer of a first unmasked portion of a semiconductor substrate while removing a silicon nitride hardmask using a wet etchant from a second masked portion thereof, in accordance with another exemplary embodiment. The method comprises providing a semiconductor substrate having a first unmasked portion and a second masked portion defined by a silicon nitride hardmask overlying the second masked portion. An epitaxial silicon layer is formed overlying at least a portion of the first unmasked portion. A protective oxide layer is formed overlying the epitaxial silicon layer. The silicon nitride hardmask is removed. The protective oxide layer is removed from the epitaxial silicon layer. The epitaxial silicon layer comprises a semiconductor material selected from the group consisting of silicon, silicon germanium (SiGe), silicon carbon (SiC), or a combination thereof.

A method for protecting a film layer on a semiconductor substrate against a hardmask-selective etch chemistry while removing a hardmask with the hardmask-selective etch chemistry is provided in accordance with yet another exemplary embodiment of the present invention. The method comprises providing a semiconductor substrate having a hardmask overlying at least a portion thereof defining an unmasked region and a masked region. A process step is carried out on the unmasked region to expose a surface of a film layer in the unmasked region. A protective oxide layer is selectively formed overlying the film layer. The hardmask is removed with the hardmask-selective etch chemistry. The protective oxide layer is removed.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
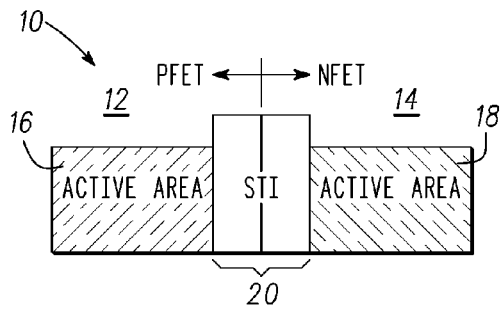
FIGS. 1-6 illustrate, in cross section, a conventional nitride hardmask integration for patterning a SiGe epitaxial silicon layer on a pFET active area, illustrating the removal of the nitride hardmask in FIG. 6 thereby causing damage to a SiGe epitaxial silicon layer on an exposed pFET active area.

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 7-10, illustrate, in cross section, methods in accordance with exemplary embodiments of the present invention for protecting a film layer such as an epitaxial silicon layer while removing a hardmask during fabrication of semiconductor devices. The various embodiments of the methods utilize a selectively grown protective oxide layer overlying the film layer of a semiconductor substrate to substantially prevent damage to the exposed film layer from wet etch chemistries typically used to remove hardmasks, particularly a nitride hardmask. While the hardmask is described herein as a deposition/growth mask, the definition should not be so limited and should be understood to include its use as a hardmask.

Various steps in the manufacture of MOS components are well known and so, in the interest of brevity, many conventional steps are only mentioned briefly herein or will be omitted entirely without providing the well known process details. As used herein, the term "MOS transistor" properly refers to a device having a gate electrode formed of a metal-comprising material and an oxide gate insulator, although it is understood that the term may also be used to refer to any semiconductor device that includes a conductive gate electrode (whether metal or other conductive material) that is positioned over a gate insulator (whether oxide or other insulator) which, in turn, is positioned over a semiconductor substrate.

The methods in accordance with exemplary embodiments of the present invention start in the same manner as the conventional nitride hardmask integration flow as shown in FIGS. 1-5 and will be described in further detail below. More specifically, referring to FIG. 1, in accordance with one exemplary embodiment, the method includes the step of providing a semiconductor substrate 10. As used herein, the term "semiconductor substrate" will be used to encompass semiconductor materials conventionally used in the semiconductor industry from which to make electrical devices and may also encompass one or more non-semiconductor film layers thereon. Semiconductor materials include monocrystalline silicon materials, such as the relatively pure or lightly impurity-doped monocrystalline silicon materials typically used in the semiconductor industry as well as silicon admixed with other elements such as germanium, carbon, and the like. The semiconductor material is preferably a silicon substrate. The silicon substrate may be a bulk silicon wafer or may be a thin layer of silicon on an insulating layer (commonly know as silicon-on-insulator or SOI) that, in turn, is supported by a carrier wafer. At least a portion of the silicon substrate is impurity doped, for example by forming N-type well regions and/or P-type well regions for the fabrication of P-channel MOS transistors and N-channel MOS transistors, respectively. N-type well regions are referred to herein as "pFET regions" 12 and P-type well regions are referred to herein as "nFET regions" 14, each having active areas referred to herein as a pFET active area 16 and an nFET active area 18. The term "active area" is intended to mean part of a transistor structure through which carriers are designed to flow. The semiconductor substrate 10 may comprise shallow trench isolation (STI) regions 20 used to electrically isolate regions of the semiconductor substrate. The trenches of the shallow trench isolation (STI) regions are generally filled with a deposited insulator, typically silicon dioxide.

Figure 2:
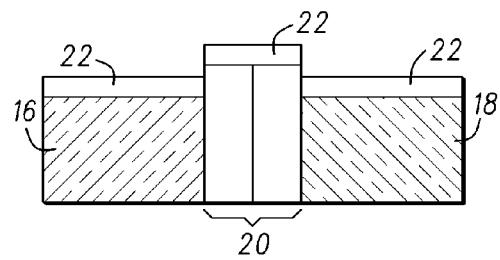

In accordance with an exemplary embodiment of the present invention, as shown in FIG. 2, after formation of the STI 20 and definition of the active areas 16 and 18, the method includes the step of depositing a nitride hardmask 22 overlying the semiconductor substrate. The hardmask material can be, for example, a layer of silicon nitride having a thickness of about 7 nm to about 15 nm. The silicon nitride can be deposited, for example, by LPCVD by the reaction of dichlorosilane and ammonia. A sacrificial oxide layer (not shown) may be provided between the nitride hardmask and the semiconductor substrate.

Figure 3:
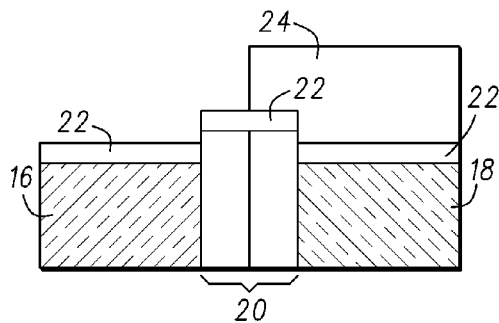
Figure 4:
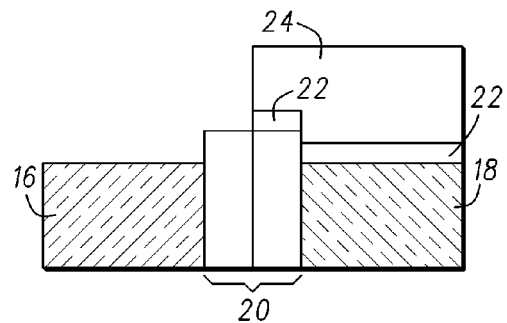

Next, a layer of photoresist 24 is provided over the nitride hardmask 22 and patterned as shown in FIG. 3. Next, a dry etch step is undertaken, removing the exposed portion of the nitride hardmask from the pFET region, with the patterned photoresist acting as an etch mask (FIG. 4), leaving the nitride hardmask portion overlying the nFET region. Subsequently, the photoresist layer 24 is removed and oxide residues removed by wet etching using sulphuric peroxide and hydrofluoric acid (HF) (not shown). This wet etching step causes a slight STI loss 25 in the pFET region as illustrated in the transition from FIG. 4 to FIG. 5.

Figure 5:
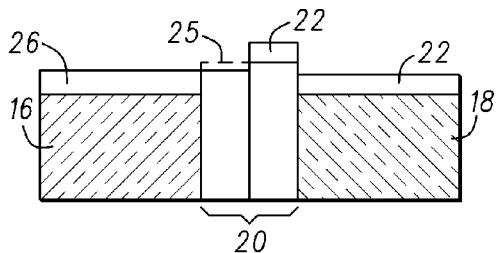
Figure 6:
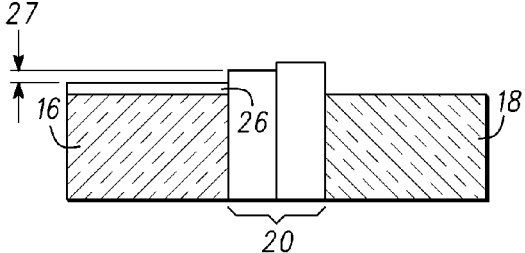
Figure 7:
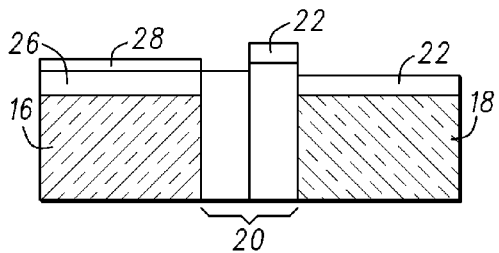
FIGS. 7-10 illustrate, in cross section, methods for protecting epitaxial silicon layers during subsequent hardmask removal in accordance with exemplary embodiments of the present invention.

Next, as shown in FIG. 5, the method comprises forming an epitaxial silicon layer 26 overlying the pFET active area 16 by selective epitaxial growth using conventional epitaxial growth conditions and processes. The epitaxial silicon layer may have a thickness from about 4 nm to about 15 nm. The thickness of the epitaxial silicon is not so limited. The epitaxial silicon layer comprises a material selected from the group consisting of silicon (Si), silicon germanium (SiGe) and silicon carbon (SiC). The epitaxial silicon layer comprised of SiGe epitaxial silicon layer typically comprises from about 15 to about 40 atomic percent germanium. The epitaxial silicon layer comprised of SiC comprises about 0.5 to about 2 substitutional atomic % carbon. While Si, SiGe and SiC epitaxial silicon layers have been described, the invention is not so limited. The present invention may be used to protect other types of film layers comprised of other silicon-containing materials that can be readily oxidized and would otherwise be damaged by use of a wet etch chemistry for removing a hardmask, including but not limited to a nitride hardmask.

Figure 8:
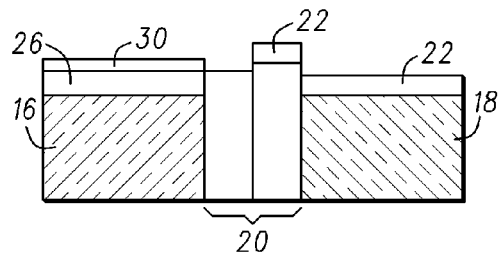

Next, in accordance with exemplary embodiments of the present invention, the method comprises selectively growing (FIG. 7) a silicon cap layer 28 overlying the epitaxial silicon layer 26 on the pFET active area 16. This can be done substantially simultaneously or immediately following the step of forming the epitaxial silicon layer (FIG. 5). Then, as shown in FIG. 8, the silicon cap layer is oxidized to form a protective silicon dioxide ($SiO_2$) cap layer overlying the epitaxial silicon layer. The silicon cap layer may be oxidized in an oxidizing ambient at an elevated temperature. Oxidizing ambients include ozone ($O_3$), oxygen ($O_2$), water vapor, steam, oxygen diluted with nitrogen, the various nitrogen-oxygen compounds ($NO_2$, NO, $N_2O$) and the various carbon-oxygen compounds (CO, $CO_2$) as is known in the art. For ozone ($O_3$), the oxidation temperature is about ambient temperature (about 25° C.). For oxygen ($O_2$), water vapor, steam, oxygen diluted with nitrogen, the various nitrogen-oxygen compounds ($NO_2$, NO, $N_2O$) and the various carbon-oxygen compounds (CO, $CO_2$), the oxidation temperatures may range from about 800° C. to about 1200° C. The silicon cap layer 28/protective silicon oxide cap layer 30 is sacrificial and therefore it is sufficient to control layer thickness within about 1 nm. The silicon cap layer 28 is oxidized until all of it is consumed to form the protective silicon oxide cap layer 30.

Figure 9:
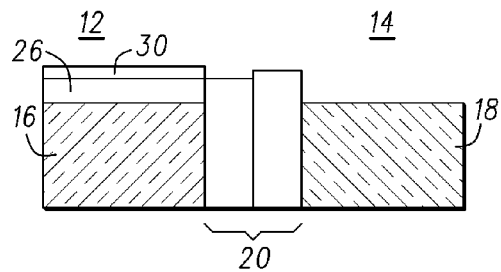
Figure 10:
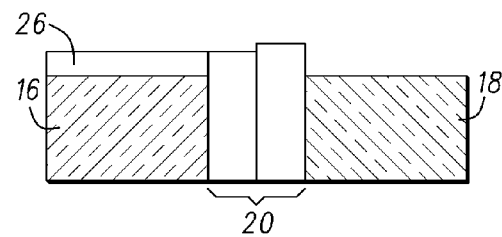

Then, as shown in FIG. 9, the nitride hardmask 22 is then removed from the nFET region 14 using a wet etchant such as hot phosphoric acid, with the protective silicon dioxide cap layer 30 protecting the epitaxial silicon layer 26 from the hot phosphoric acid. Silicon dioxide is substantially etch resistant to hot phosphoric acid. As shown in FIG. 10, the protective silicon dioxide cap layer 30 is then etched off the epitaxial silicon layer 26 using hydrofluoric acid (HF). The epitaxial silicon layer is etch resistant to hydrofluoric acid (HF).

Figure 11:
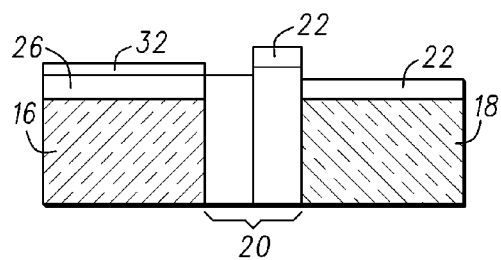
FIGS. 11-13 illustrate, in cross section, methods for protecting epitaxial silicon layers during subsequent hardmask removal in accordance with another exemplary embodiment of the present invention.
Figure 12:
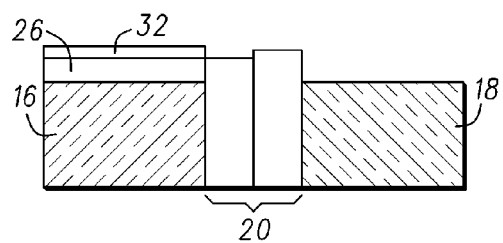
Figure 13:
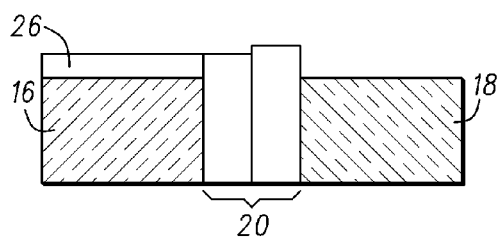

Referring to FIG. 11, in an alternative embodiment, a protective oxide layer 32 is selectively formed on the epitaxial silicon layer 26 only. For example, the protective oxide layer 32 may be formed by oxidizing the epitaxial silicon layer 26 or by selectively depositing an oxide layer. The protective oxide layer 32 may be a silicon oxide layer or other oxide layer. With the protective oxide layer in place over the epitaxial silicon layer, hot phosphoric acid may be used to remove the nitride hardmask 22 from the nFET region 14 followed by removal of the protective oxide layer 32 as shown respectively in FIGS. 12 and 13. As used herein, "protective oxide layer" includes both the selectively grown protective silicon dioxide cap layer 30 and the selectively formed protective oxide layer 32.

While formation of an epitaxial silicon layer on the PFET active area and a hardmask on the NFET region has been described, the invention is not so limited. The epitaxial silicon layer may instead be formed on the NFET active area by using the hardmask on the PFET region. When the hardmask is used as an etch mask, the process step of etching an unmasked region of the semiconductor substrate can expose a film layer or portion of a film layer that is present on the semiconductor substrate including the surface of the semiconductor substrate itself.

Thereafter, the resultant structure is cleaned and subjected to further processing. Such further processing includes deposition or growth of a gate insulator comprised of a gate dielectric. The gate insulator may be a silicon oxide, especially silicon dioxide ($SiO_2$) and silicon nitrides, silicon oxynitride (SiON), high K dielectrics, and low K dielectrics. After deposition or growth of the gate insulator, the gate electrode is patterned to form a gate stack followed by patterning of the source and drain regions, and subsequent implantation or diffusion of dopants to obtain the desired electrical properties.

From the foregoing, it is to be appreciated that by using selective oxide growth to form a protective oxide layer on critical and sensitive film layers such as epitaxial silicon layers before nitride hardmask removal, damage to the film layers is substantially prevented.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor device comprising the steps of:
   providing a semiconductor substrate having pFET and nFET regions, each having active areas and shallow trench isolation;
   forming a hardmask layer overlying the semiconductor substrate;
   providing a photoresist layer over the hardmask layer;

patterning the phoresist layer;

removing an exposed portion of the hardmask layer from one of the pFET region and nFET region with the patterned photoresist acting as an etch mask to define a masked region and an unmasked region;

forming an epitaxial silicon layer on the active area in the unmasked region;

forming a protective oxide layer overlying the epitaxial silicon layer;

removing the hardmask layer from the masked region with the protective oxide layer protecting the epitaxial silicon layer during such removal step; and removing the protective oxide layer from the epitaxial silicon layer.

2. The method of claim 1, wherein the step of forming the hardmask layer comprises depositing a layer of silicon nitride ($Si_3N_4$).

3. The method of claim 1, wherein the step of forming the epitaxial silicon layer comprises forming the epitaxial silicon layer comprising a semiconductor material selected from the group consisting of silicon, silicon germanium (SiGe) and silicon carbon (SiC).

4. The method of claim 1, wherein the step of forming the protective oxide layer comprises forming the protective oxide layer from a silicon oxide.

5. The method of claim 4, wherein the step of forming the protective oxide layer comprises the steps of:
growing a silicon cap layer overlying the epitaxial silicon layer; and
oxidixing the silicon cap layer to form the protective oxide layer comprising a protective silicon dioxide cap layer.

6. The method of claim 4, wherein the step of forming the protective oxide layer comprises selectively forming an oxide layer overlying the epitaxial silicon layer.

7. The method of claim 5, wherein the step of growing a silicon cap layer overlying the epitaxial silicon layer occurs immediately following the step of forming the epitaxial silicon layer on the active area.

8. The method of claim 1, wherein the step of removing the hardmask layer comprises etching the hardmask layer using hot phosphoric acid.

9. The method of claim 3, wherein the method further comprises forming a gate stack overlying the epitaxial silicon layer comprising a high dielectric constant material.

10. A method for protecting an epitaxial silicon layer of a first unmasked portion of a semiconductor substrate while removing a silicon nitride hardmask using a wet etchant from a second masked portion thereof comprising the steps of:
providing a semiconductor substrate having a first unmasked portion and a second masked portion defined by a silicon nitride hardmask overlying the second masked portion;
forming an epitaxial silicon layer overlying at least a portion of the first unmasked portion;
forming a protective oxide layer overlying the epitaxial silicon layer;
removing the silicon nitride hardmask; and
removing the protective oxide layer from the epitaxial silicon layer, wherein the epitaxial silicon layer comprises a semiconductor material selected from the group consisting of silicon, silicon germanium (SiGe), silicon carbon (SiC), or a combination thereof.

11. The method of claim 10, wherein the step of forming the protective oxide layer comprises forming the protective oxide layer from a silicon oxide.

12. The method of claim 11, wherein the step of forming the protective oxide layer comprises the steps of:
growing a silicon cap layer overlying the epitaxial silicon layer; and
oxidixing the silicon cap layer to form the protective oxide layer comprising a protective silicon dioxide cap layer.

13. The method of claim 10, wherein forming the protective oxide layer comprises selectively forming an oxide layer overlying the epitaxial silicon layer.

14. The method of claim 10, wherein the step of removing the silicon nitride hardmask comprises etching the silicon nitride hardmask using hot phosphoric acid.

15. A method for protecting a film layer on a semiconductor substrate against a hardmask-selective etch chemistry while removing a hardmask with the hardmask-selective etch chemistry comprising the steps of:
providing a semiconductor substrate having a hardmask overlying at least a portion thereof defining an unmasked region and a masked region, wherein the step of providing the semiconductor substrate having the hardmask comprises depositing a layer of silicon nitride ($Si_3N_4$) overlying at least a portion of the semiconductor substrate;
carrying out a process step on the unmasked region to expose a surface of a film layer in the unmasked region;
selectively forming a protective oxide layer overlying the film layer;
removing the hardmask with the hardmask-selective etch chemistry; and
removing the protective oxide layer.

16. The method of claim 15, wherein the step of carrying out a process step on the unmasked region comprises one of etching and depositing to expose the surface of a film layer in the unmasked region.

17. The method of claim 15, wherein the step of selectively forming the protective oxide layer comprises forming the protective oxide layer from a silicon oxide.

18. The method of claim 17, wherein the step of selectively forming the protective oxide layer comprises the steps of:
growing a silicon cap layer overlying the film layer; and
oxidixing the silicon cap layer to form the protective oxide layer comprising a protective silicon dioxide cap layer.

19. The method of claim 16, wherein selectively forming the protective oxide layer comprises selectively growing an oxide layer overlying the film layer.

* * * * *